United States Patent [19]
Sun

[11] Patent Number: 6,044,098
[45] Date of Patent: Mar. 28, 2000

[54] DEEP NATIVE OXIDE CONFINED RIDGE WAVEGUIDE SEMICONDUCTOR LASERS

[75] Inventor: Decai Sun, Sunnyvale, Calif.

[73] Assignee: Xerox Corporation, Stamford, Conn.

[21] Appl. No.: 08/920,444

[22] Filed: Aug. 29, 1997

[51] Int. Cl.$^7$ ....................................................... H01S 3/19
[52] U.S. Cl. ................................ 372/46; 372/94; 385/131
[58] Field of Search .................................. 372/43, 44, 46, 372/93, 94; 385/14, 130, 131

[56] References Cited

U.S. PATENT DOCUMENTS

| | | | |
|---|---|---|---|
| 5,262,360 | 11/1993 | Holonyak, Jr. et al. | 437/237 |
| 5,327,448 | 7/1994 | Holonyak, Jr. et al. | 372/94 |
| 5,832,019 | 11/1998 | Paoli et al. | 372/46 |

OTHER PUBLICATIONS

Cheng et al., "Lasing Characteristics of High–Performance Narrow–Stripe InGaAs–GaAs Quantum Well Lasers Confined by AlAs Native Oxide", *IEEE Photonics Technology Letters,* vol. 8, No. 2, Feb. 1996, pp. 176–178.

Krames et al., "Deep–oxide planar buried–heterostructure AlGaAs–GaAs quantum well heterostructures laser diodes", *Appl. Phys. Lett.,* vol. 65 (25), Dec. 19, 1994, pp. 3221–3223.

Kish et al., "Properties and Use of In0.5(AlxGa1–x)0.5P and AlxGa1–xAs Native Oxides in Heterostructure Lasers", *Journal of Electronic Materials,* vol. 21, No. 12, 1992, pp. 1133–1139. (no month).

Carraci et al., "High–performance planar native–oxide buried–mesa index–guided AlGaAs–GaAs quantum well heterostructure lasers", *Appl. Phys. Lett.,* vol. 61 (3), Jul. 20, 1992, pp. 321–323.

*Primary Examiner*—Hemang Sanghavi
*Assistant Examiner*—Benjamin Cushwa
*Attorney, Agent, or Firm*—William Propp

[57] ABSTRACT

A ridge waveguide semiconductor laser structure fabricated by etching and wet oxidation. The upper cladding layer is partially etched forming a ridge and a native oxide layer is wet oxidized from the remaining upper cladding layer and the active region outside the ridge. The deep native oxide layer provides strong optical confinement to the ridge waveguide. Alternately, the active region can be narrower than the ridge waveguide in the laser structure. The ridge waveguide semiconductor laser structures with native oxide layers can also be curved geometry lasers such as ring lasers.

12 Claims, 5 Drawing Sheets

FIG. 9
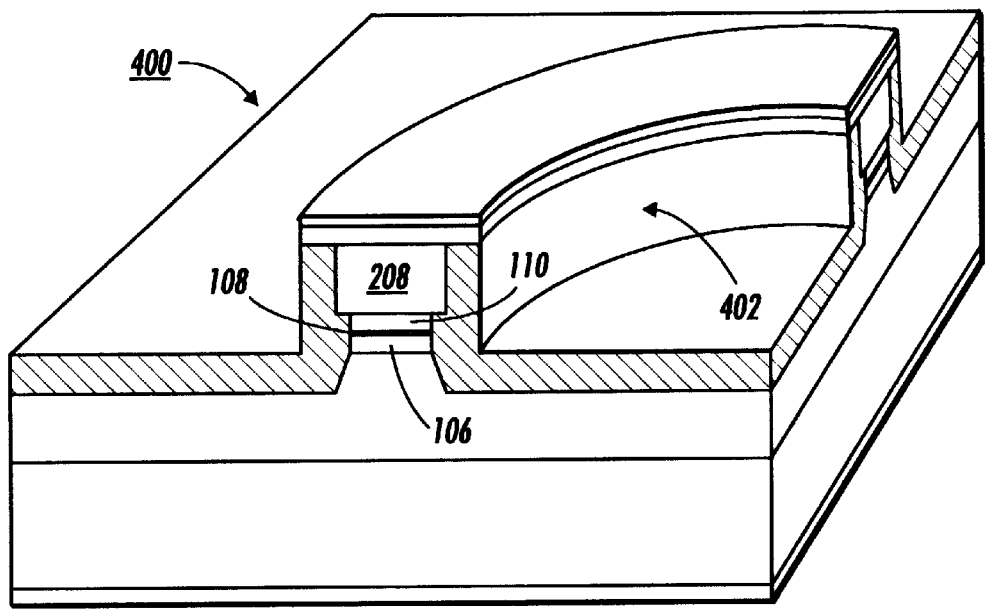
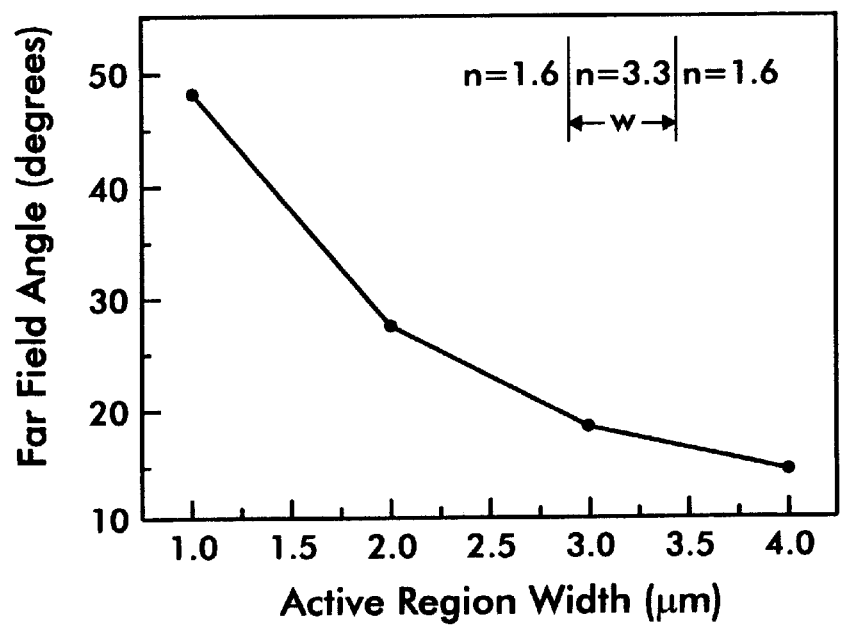
FIG. 10

DEEP NATIVE OXIDE CONFINED RIDGE WAVEGUIDE SEMICONDUCTOR LASERS

BACKGROUND OF THE INVENTION

This invention relates to a ridge waveguide semiconductor laser and, more particularly, a ridge waveguide semiconductor laser using a deep native oxide layer formed from the upper cladding layer and the active layer of the semiconductor laser structure for optical confinement and electrical isolation.

Solid state semiconductor lasers are very desirable light sources for high speed laser printing, optical fiber communications and other applications. A common laser structure is a so-called "edge emitting laser" where light is emitted from the edge of a monolithic structure of semiconductor layers.

A ridge waveguide can form the lateral optical confinement structure for the semiconductor laser and thus the ridge precisely defines the origin of the edge emission of light from the semiconductor laser. A ridge waveguide is typically a small ridge of semiconductor material with a generally flat upper surface and sloped sidewalls on top of the active semiconductor layer in a semiconductor laser structure.

One method of forming a ridge waveguide is to etch away a portion of the upper cladding layer of the epitaxially deposited semiconductor layers of the laser structure, leaving a narrow ridge of the cladding layer material to define the lateral ridge waveguide. The particular geometry of the ridge depends upon the etching means. Chemical etching tends to form sloped walls to the ridge whereas ion beam etching tends to create straight sidewalls. In addition, ion beam etching can create walls with a controlled slope.

Another method of forming a ridge waveguide is to disorder portions of the upper cladding layer by impurity diffusion. This impurity induced layer disordering (IILD) causes an intermixing of elements in the disordered regions of the cladding layer, lowering the index of refraction compared to the undisordered regions. A central undisordered region between adjacent disordered regions forms the lateral ridge, index-guided, waveguide. Index guiding refers to the use of variations in the optical index of refraction between semiconductor layers of different materials to provide for a waveguide to optically confine the emission of light from one of the semiconductor layers.

Generally, formation of native oxides in a laser is an important step to achieving good electrical and optical confinement in the structure. One approach in oxide formation is commonly known as the "surface-oxidation" technique. Examples of such an approach are described in U.S. Pat. No. 5,327,448 entitled "Semiconductor Devices and Techniques For Controlled Optical Confinement" and U.S. Pat. No. 5,262,360 entitled "AlGaAs Native Oxide," both of which were invented by Holonyak et al.

As discussed in these patents, under the "surface-oxidation" approach, a cap GaAs layer is placed above a thick AlGaAs layer with a high aluminum content, which is deposited above the active layer of a laser structure. Under this "surface-oxidation" approach, the surface of the sample is first patterned with silicon nitride, protecting and exposing parts of the GaAs cap layer. The exposed GaAs areas are then removed by chemical etching exposing the surface of the underlying AlGaAs layer which has a high aluminum content. The sample is then oxidized in water vapor where the oxidation in the AlGaAs layer proceeds downwards from the surface until it reaches the active layer which has a lower aluminum content. Since the active layer has a lower aluminum content, the oxidation process essentially stops when it reaches the active layer, providing electrical and optical confinement to the laser structure.

Another approach towards forming oxides is a so-called "buried-layer" oxidation approach which is described in "Lasing Characteristics of High-Performance Narrow Stripe InGaAs-GaAs Quantum-Well Lasers Confined by AlAs Native Oxide," IEEE Photonics Technology Letters, Vol. 8, No. 2, p. 176 (February 1996) by Cheng et al. Under this approach, an AlAs layer is placed above and below the active layer of a laser structure. Then, grooves are etched, forming an exposed stripe mesa structure between the grooves. As a result of the etching, the AlAs layers sandwiching the active layer are exposed along the sidewalls of the mesa. During an oxidation process, these AlAs layers are oxidized laterally from the sidewalls of the mesa inwards towards the center of the mesa. However, other layers in the structure remain essentially unoxidized since their aluminum content is lower. The oxidized AlAs layers reduce the effective refractive index of the regions both above and underneath them, providing lateral electrical and optical confinement to the sandwiched active layer. Another discussion regarding the "buried-layer" technique is described in "High-Performance Planar Native-Oxide Buried-Mesa Index-Guided AlGaAs-GaAs Quantum Well Heterostructure Lasers," Appl. Phys. Lett. vol. 61 (3), p. 321 (July 1992) by Smith et al.

The key disadvantage of the "buried-layer" approach is the difficulty in controlling the amount of oxidation. Because the oxidation rate of AlAs or AlGaAs with a high aluminum content depends upon aluminum composition and process variations, any variation in aluminum composition or process parameters will be reflected by changes in the oxidation rate, which in turn creates uncertainty in the amount of oxidation. The process is relatively temperature-sensitive. Therefore, when such a technique is applied to forming lasers, the devices typically have manufacturability and yield problems.

Accordingly, there is a need for a ridge waveguide semiconductor laser with a native oxide layer providing optical confinement.

SUMMARY OF THE INVENTION

The present invention provides a ridge waveguide semiconductor laser structure fabricated by etching and wet oxidation. The upper cladding layer is partially etched forming a ridge and a native oxide layer is wet oxidized from the remaining upper cladding layer and the active region outside the ridge. The deep native oxide layer provides strong optical confinement to the ridge waveguide.

Alternately, the active region can be narrower than the ridge waveguide in the laser structure. The ridge waveguide semiconductor laser structures with native oxide layers can also be curved geometry lasers such as ring lasers.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 9 is a cross-sectional side view of a ridge waveguide ring laser structure of the present invention.

FIG. 10 is a graph showing the lateral far-field divergence angle versus the ridge width of the ridge waveguide laser structure of FIG. 3.

DETAILED DESCRIPTION OF THE PREFERRED EMBODIMENTS

Figure 1:
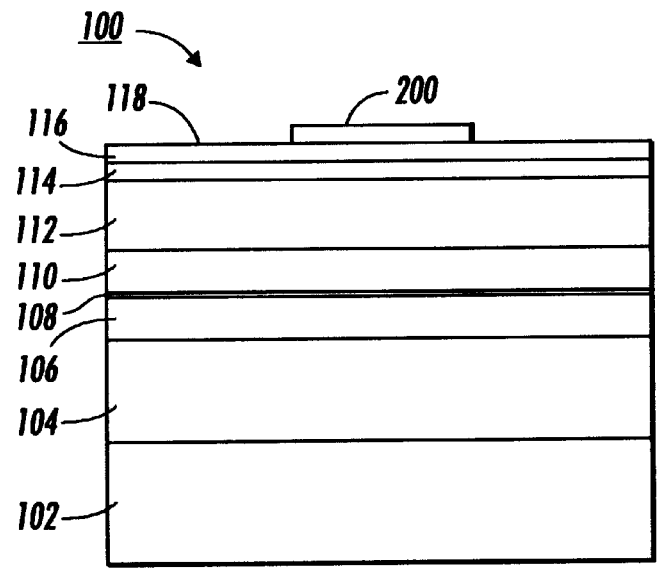
FIG. 1 is a cross-sectional side view of the semiconductor layers of the ridge waveguide laser structure of the present invention.

FIG. 1 illustrates an semiconductor laser structure 100 fabricated by wet oxidation of the upper cladding layer and active layer to form a ridge waveguide with a native oxide layer in accordance to the present invention.

As shown in FIG. 1, an n-type $Al_{0.5}In_{0.5}P$ lower cladding layer 104 is grown on an n-type GaAs substrate 102 using a well-known epitaxial deposition process commonly referred to as metal-organic chemical vapor deposition (MOCVD). Other deposition processes such as liquid phase epitaxy (LPE), molecular beam epitaxy (MBE), or other known crystal growth processes can also be used. The aluminum mole fraction and doping level of the lower cladding layer 104 range from 50 percent and 1 to $5\times10^{18}$ $cm^{-3}$ respectively. The thickness of the AlInP cladding layer 104 is approximately one micron ($\mu$m). The doping level of the n-type GaAs substrate 102 is approximately $5\times10^{18}$ $cm^{-3}$ or higher. Although not illustrated, a buffer layer may be deposited prior to the deposition of the lower cladding layer 104 in the event that lower throughputs are acceptable.

Above these layers is an undoped $Al_{0.4}Ga_{0.6}As$ lower confinement layer 106, which has an aluminum content of about 40% and a thickness of about 120 nanometers. After this lower confinement layer 106 has been deposited, a GaAs active layer 108 is deposited, which should result in a light emission at 840 nanometers. The active layer 108 may be a single quantum well, a multiple quantum well, or a layer with thickness greater than that of a quantum well. The thickness of a quantum well typically ranges from five to twenty nanometers. Above the active layer 108 is an undoped $Al_{0.4}Ga_{0.6}As$ upper confinement layer 110. The aluminum content of this confinement layer 110 is typically 40% and a thickness of about 120 nanometers. The lower and upper confinement layers, 106 and 110, together with the active layer 106, generally produce a laser structure with a lower threshold current and a smaller optical divergence.

After the upper confinement layer 110 has been formed, a p-type $Al_{0.5}In_{0.5}P$ upper cladding layer 112 of about one micron is deposited. Typically, this cladding layer 112 has an aluminum content of 50% and a magnesium doping level of $5\times10^{18}$ $cm^{-3}$. Upon the upper p-type $Al_{0.5}In_{0.5}P$ cladding layer 112 is a $Ga_{0.5}In_{0.5}P$ layer 114, which typically has an aluminum composition of 40%, a thickness of 50 nanometers, and a magnesium doping level of approximately $5\times10^{18}$ $cm^{-3}$. This GaInP layer 114, along with a p+-GaAs cap layer 116 deposited on the GaInP layer 114, facilitate the formation of ohmic contacts to the laser structure. The p+-GaAs cap layer 116 is typically 100 nanometers with a magnesium doping of $1\times10^{19}$ $cm^{-3}$.

After all the semiconductor layers of the semiconductor structure 100 shown in FIG. 1 have been deposited, a silicon nitride stripe 200 is formed on the upper surface 118 of the semiconductor structure by a photolithographic process. The silicon nitride stripe is 4 microns wide and runs lengthwise down the surface 118 of the semiconductor structure.

Figure 2:
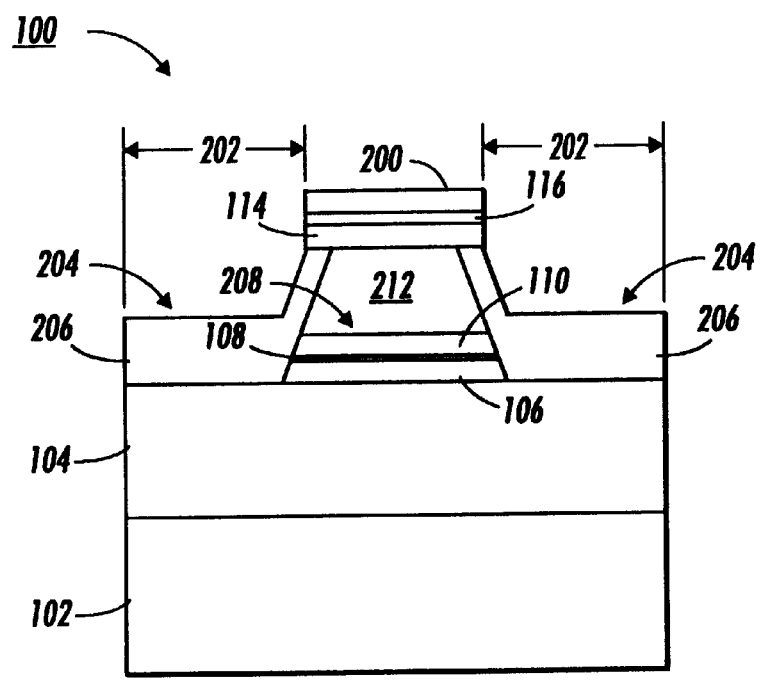
FIG. 2 is a cross-sectional side view of the semiconductor layers of the ridge waveguide laser structure of the present invention after etching and wet oxidation.

As shown in FIG. 2, the semiconductor structure 100 is etched in the areas 202 on either side of the silicon nitride stripe to form grooves 204. The grooves are etched by a process such as reactive ion etching which provides for the formation of a deep depression with angled sidewalls. The groove 204 is etched through the GaAs cap layer 116, through the GaInP layer 114, and partially through the $Al_{0.5}In_{0.5}P$ upper cladding layer 112 to a depth of 800 nanometers leaving 200 nanometers of the upper cladding layer 112 remaining on the upper confinement layer 110.

After the formation of the grooves with the silicon nitride stripe 200 remaining on the surface, the semiconductor structure 100 undergoes a wet oxidation step. The structure is typically oxidized with water vapor in a nitrogen environment at elevated temperatures, in excess of 530° C. for approximately 4 hours. During the oxidation process, the remaining upper cladding layer 112 shown in FIG. 2 is exposed to the ambient through the grooves 204. Thus, the upper cladding layer 112, which comprises of AlINP with a high aluminum content, is oxidized radially outwards from each of the grooves into a native oxide layer 206.

During the wet oxidation, the remaining $Al_{0.5}In_{0.5}P$ upper cladding layer 112 outside the silicon nitride stripe 200 is oxidized first, then the active region of the upper $Al_{0.4}Ga_{0.6}As$ confinement layer 110, the GaAs active layer 108 and the lower $Al_{0.4}Ga_{0.6}As$ confinement layer 106 outside the silicon nitride stripe 200 are oxidized.

Figure 3:
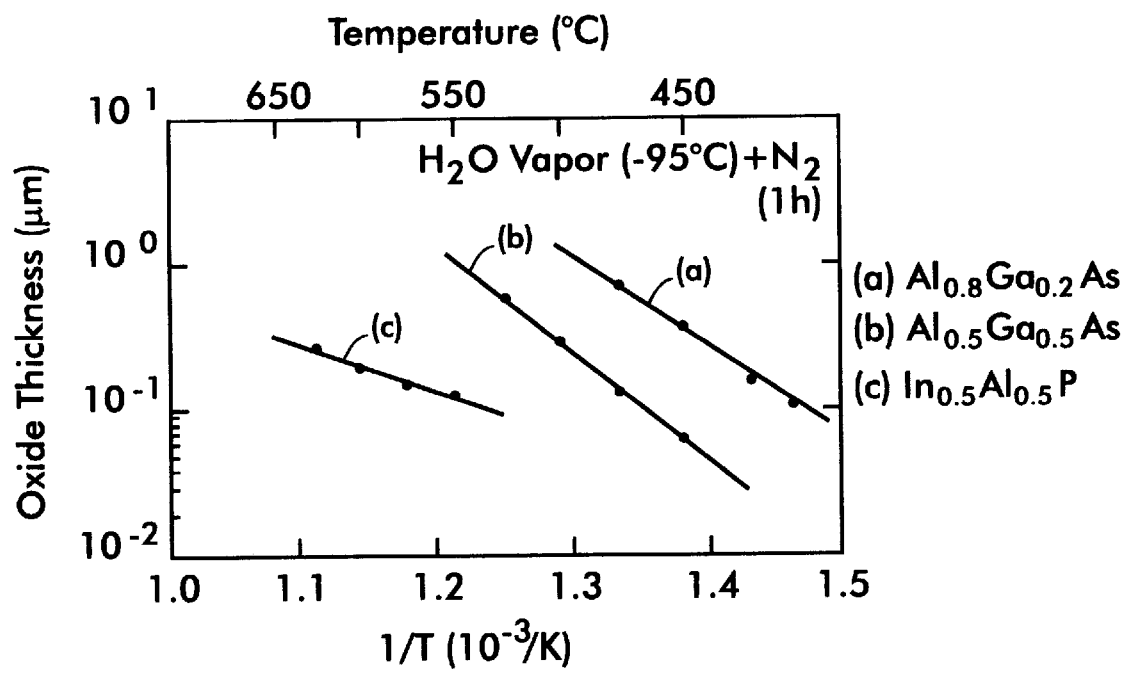
FIG. 3 is a graph of the oxidation thickness versus inverse temperature for several semiconductor materials.

An $Al_{0.5}In_{0.5}P$ semiconductor material oxidizes much slower than $Al_xGa_{1-x}As$ (x>0.4) semiconductor material, as shown in FIG. 3. Utilizing the selective oxidation of $Al_{0.5}In_{0.5}P$ (slower oxidation) and AlGaAs alloys (faster oxidation), ridge waveguide laser structures with deep native oxide layers can be fabricated by oxidizing through the AlGaAs/GaAs active region without pinching off the p-$Al_{0.5}In_{0.5}P$ cladding region. The oxidation rates are alloy dependent with the phosphide-base alloy oxidizing more slowly than the arsenide-base alloy.

It is impossible to form such a deep native oxide layer ridge waveguide structure by a simple oxidation step in a regular AlGaAs infrared laser structure, in which $Al_xGa_{1-x}As$ (x>0.7) is used in the p-cladding layer. Because an AlGaAs alloy with the Al composition over 70% oxidation oxidizes at a rate much faster than $Al_{0.4}Ga_{0.6}As$ used in the active region, the p-cladding layer would be pinched off and totally oxidized first.

Upon completion of oxidation as shown in FIG. 2, the silicon nitride stripe is removed. The native oxide layer 206 has been formed from the $Al_{0.5}In_{0.5}P$ upper cladding layer 112, the $Al_{0.4}Ga_{0.6}As$ lower confinement layer 106, the GaAs active layer 108, and the $Al_{0.4}Ga_{0.6}As$ upper confinement layer 110 not covered by the silicon nitride strip.

Figure 4:
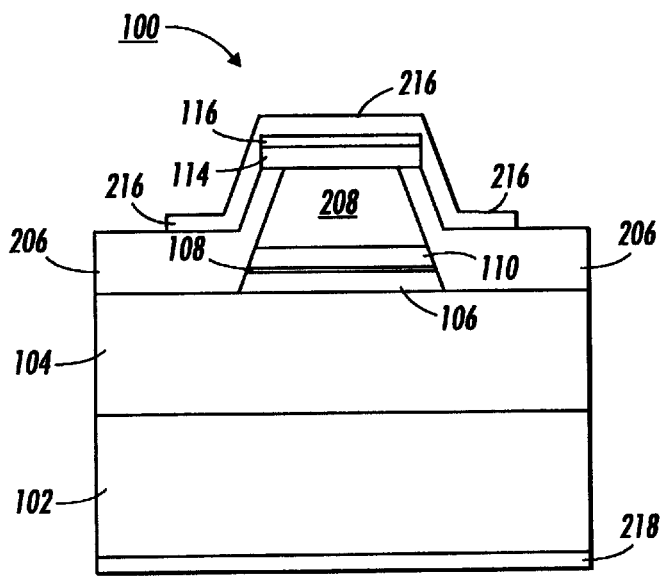
FIG. 4 is a cross-sectional side view of the ridge waveguide laser structure of the present invention.

The remaining unoxidized $Al_{0.4}Ga_{0.6}As$ lower confinement layer 106, GaAs active layer 108, and $Al_{0.4}Ga_{0.6}As$ upper confinement layer 110 form the active region for light emission as shown in FIG. 4. The remaining unoxidized $Al_{0.5}In_{0.5}P$ upper cladding layer 112 forms the ridge waveguide 208 for optical confinement of the light emitted from the active region.

The ridge waveguide 208 is index-guided. The index of refraction of the native oxide layer 206 is approximately 1.6, the index of refraction of the active region 106, 108 and 110 is about 3.2 and the index of refraction of the AlInP ridge waveguide 208 is approximately 3.0. The differences in indices of refraction provide a strong optical confinement of the light emitted by the active region by the ridge waveguide.

The native oxide regions 206 also improve the current confinement ability of the laser structure and severely limits current spreading.

The boundaries between the active region, the ridge waveguide and the native oxide layers are relatively smooth and sharp as they are defined by an epitaxial growth process and a photolithography process. The spacing between the oxide regions 206 are controlled by using a photolithography mask and etch process. Since the photolithography process has a high degree of accuracy, the spacing between the oxide regions 206 can be minimal. Also, since these oxidized regions are defined after the epitaxial process has been completed, this approach allows for a high degree of process flexibility.

After the oxidation process, metal contacts 216 and 218 are formed on the surface and the bottom side of the substrate respectively for biasing the laser, as shown in FIG. 4. The upper electrode 216 can cover just the contact layers 114 and 116 or, as shown in the FIG. 4, extend down the ridge to partially cover the electrically insulating native oxide layer 206. A typical material used for forming the contacts is a titanium/gold bilayer film.

Figure 5:
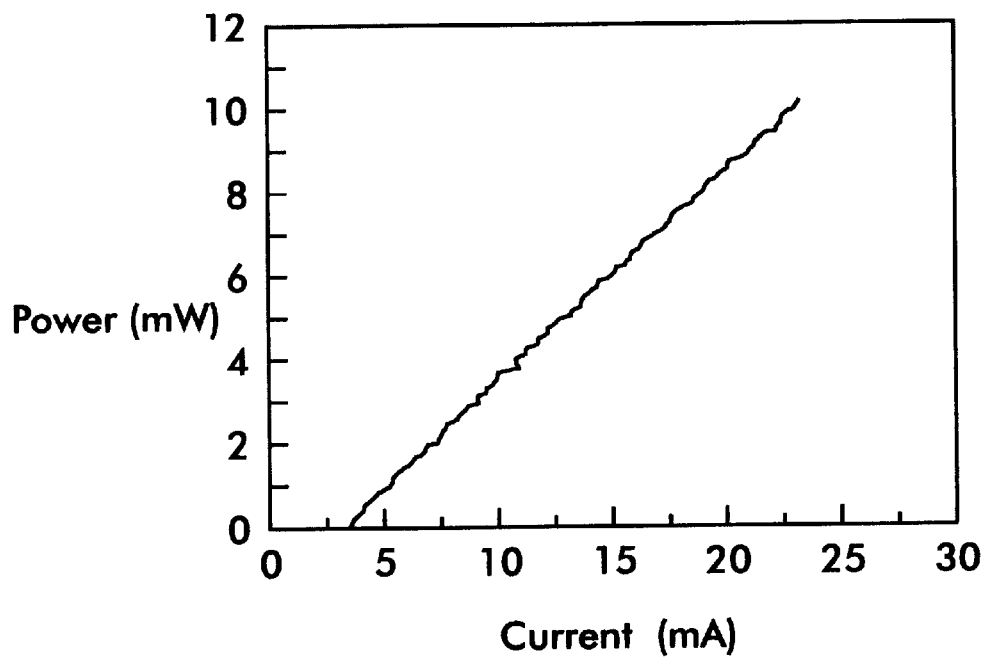
FIG. 5 is a graph showing the power-current curve of the ridge waveguide laser structure of FIG. 4.
Figure 6:
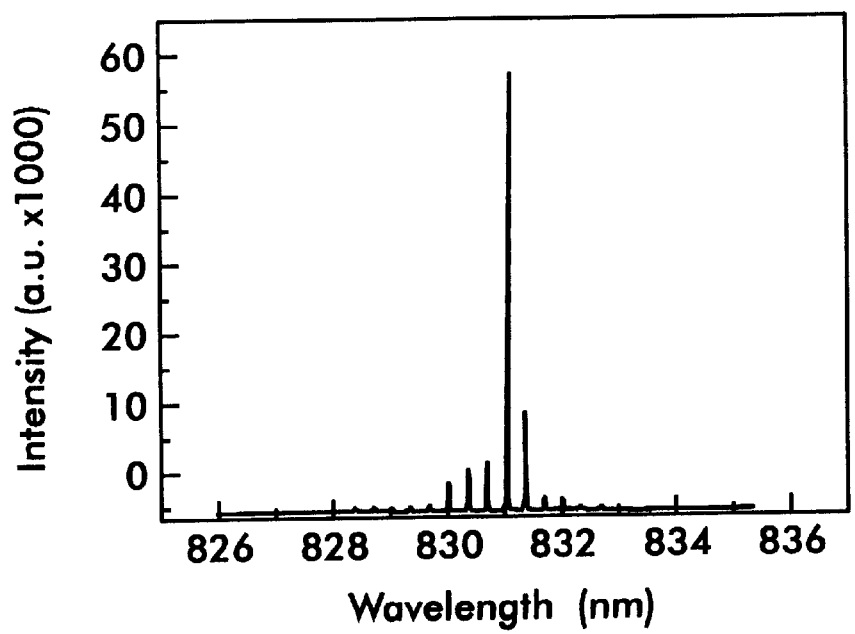
FIG. 6 is a graph showing the CW spectrum of the ridge waveguide laser structure of FIG. 4.
Figure 7:
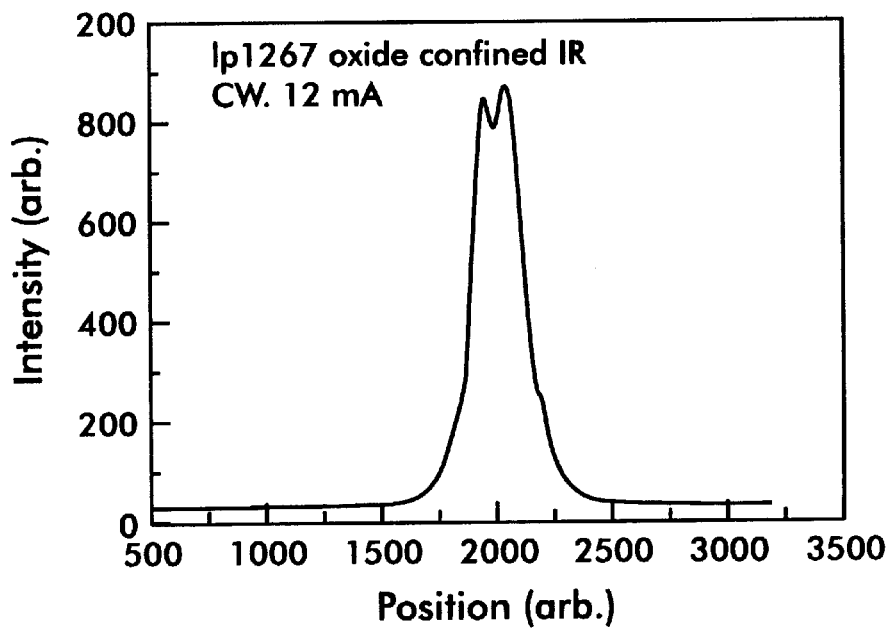
FIG. 7 is a graph showing the beam profile of the ridge waveguide laser structure of FIG. 4.

The laser structure 100 has a 250 μm long cavity, extending lengthwise in the semiconductor structure 100, and is coated with a high reflection dielectric mirror stack (R>95%) on the rear facet (not shown) and a passivation layer (R~25%) on the front or emission facet (also not shown). The laser structure 100 has a CW threshold current of 3.5 mA and a differential quantum efficiency of 35%/facet. The L-I curve is shown in FIG. 5. The output spectrum at 9 mA is shown in FIG. 6. The beam profile was studied using a beam profiler. A single peak was observed along the lateral direction when the driving current is less than 11 mA. As the driving current was increased, twin peaks were observed as shown in FIG. 7. For single transverse mode operation, the ridge width needs to be less than 1 μm from waveguide mode calculations.

The native oxide layers also provide good heat dissipation. The native oxide layers have excellent thermal conductance of 30 W/km, which is five times better than the AlInP of the cladding layer and waveguide and twice higher than that of GaAs cap layer. Since the laser elements have low threshold and high efficiency, the thermal cross-talk among adjacent laser diodes is expected to be small.

Figure 8:
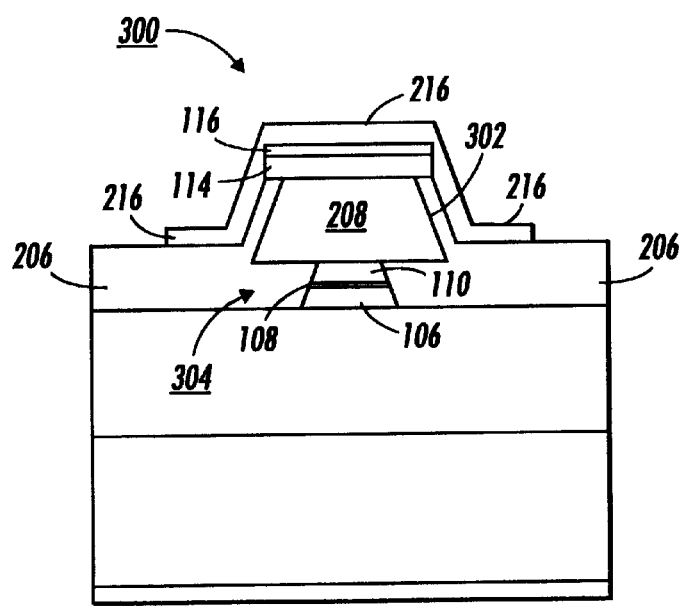
FIG. 8 is a cross-sectional side view of a second embodiment of the ridge waveguide laser structure of the present invention.

In the second embodiment of the ridge waveguide semiconductor laser structure 300 of FIG. 8, the semiconductor layers, the etching process and the wet oxidation process are all the same as with the ridge waveguide semiconductor laser structure 100 of FIG. 4, except the etch is deeper laterally into the active region than the upper cladding layer.

The sidewalls 302 of the upper cladding layer 112 are etched the same. The sidewalls 304 of the upper confinement layer 110, the active layer 108 and the lower confinement layer 106 are etched deeper laterally. Accordingly, after wet oxidation, the native oxide layer 206 extends deeper laterally into the active region of the upper confinement layer 110, the active layer 108 and the lower confinement layer 106 than the upper cladding layer 112. Thus, the active region is narrower than the ridge waveguide 208. A narrower active region reduces the threshold current and reduces the higher order modes by increasing the loss for the higher order modes while maintaining a low loss for the fundamental modes.

The semiconductor laser structure 400 of FIG. 9 is a ring laser. The semiconductor laser structure 400 is the same structure as the ridge waveguide semiconductor laser structure 100 of FIG. 4 or the same structure as the ridge waveguide 300 of FIG. 8, except that the active region of the upper confinement layer 110, the active layer 108 and the lower confinement layer 106, the upper electrode 216 and the ridge waveguide 208 are on a curved path 402. The other semiconductor layers of the ridge waveguide semiconductor laser structure can be curved but it is not essential.

The curved path 402 of a ring laser makes optical confinement very difficult. It is only when the differences of the indices of refraction are very large, as with the ridge waveguide 208 of the present invention, that light can be internally reflected along a curve path to be emitted by the laser.

There are several advantages to using the wet oxidation technique for the fabrication of monolithic laser structures. Wet oxidation will replace the etching and regrowth approach used for defining buried ridge waveguide laser structures, leading to higher yield and better diode performance. Strong optical confinement will enable the fabrication of narrower stripe lasers and curved geometry lasers (such as ring cavity lasers). It is possible to fabricate very closely spaced edge emitting laser arrays using narrower stripes. Larger lateral index step also means larger lateral diffraction angle for a narrower stripe. This could shape the output beam profile to be more symmetric, more suitable for optic-fiber coupling and other applications which require a more circular beam shape.

The far field divergence angle of the fundamental mode is calculated as a function of the width of the active region, as plotted in FIG. 10. When the active region is 1 μm wide, the lateral far field divergence angle is 48°, close to the perpendicular far field divergence angle. Thus, it is possible to make the output beam circular by making the oxide stripe width small.

Another benefit of using $Al_{0.5}In_{0.5}P$ alloy for the cladding layer is that AlInP has a much larger bandgap that AlGaAs. Infrared lasers with AlInP cladding layers will have a smaller leakage current at higher operating temperatures than all AlGaAs lasers.

Although the laser structure consists of AlInP/AlGaAs alloys, the ridge waveguide semiconductor laser with native oxide layers of the present invention would work with other semiconductor materials such as $In_{0.5}(AlGa)_{0.5}P$/AlGaAs to cover lasing wavelength from 0.7 to 1 μm The composition, dopants, doping levels, and dimensions given above are exemplary only, and variations in these parameters are permissible. Additionally, other layers in addition to the ones shown in the figures may also be included. Variations in experimental conditions such as temperature and time are also permitted.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

I claim:

1. A ridge waveguide semiconductor laser comprising:

a substrate;

an n-type $Al_{0.5}In_{0.5}P$ first cladding layer formed on said substrate;

an undoped $Al_{0.4}Ga_{0.6}As$ first confinement layer, a GaAs active layer, and an undoped $Al_{0.4}Ga_{0.6}As$ second confinement layer forming an active region on said first cladding layer;

a ridge waveguide formed from a p-type $Al_{0.5}In_{0.5}P$ second cladding layer formed above said active region, said ridge waveguide providing optical confinement for light emission from said active region, said ridge waveguide being defined by native oxide layers formed in grooves, said native oxide layers being formed from said second cladding layer and said active region; and first and second electrodes which enable biasing of said active region.

2. The ridge waveguide semiconductor laser of claim 1 wherein said native oxide layers comprise a native oxide of an aluminum-containing semiconductor material.

3. The ridge waveguide semiconductor laser of claim 1 wherein said active region underneath said ridge waveguide is narrower than said ridge waveguide.

4. A ridge waveguide semiconductor laser comprising:

a substrate;

an n-type first cladding layer formed on said substrate;

a first confinement layer, an active layer, and a second confinement layer forming an active region on said first cladding layer;

a ridge waveguide formed from a second cladding layer formed above said active region, said second cladding layer having a slower oxidation rate than said active region, said ridge waveguide providing optical confinement for light emission from said active region, said ridge waveguide being defined by native oxide layers formed in grooves, said native oxide layers being formed from said second cladding layer and said active region; and first and second electrodes which enable biasing of said active region.

5. The ridge waveguide semiconductor laser of claim 4 wherein said native oxide layers comprise a native oxide of an aluminum-containing semiconductor material.

6. The ridge waveguide semiconductor laser of claim 4 wherein said active region underneath said ridge waveguide is narrower than said ridge waveguide.

7. A ridge waveguide semiconductor ring laser comprising:

a substrate;

an n-type $Al_{0.5}In_{0.5}P$ first cladding layer formed on said substrate;

an undoped $Al_{0.4}Ga_{0.6}As$ first confinement layer, a GaAs active layer, and an undoped $Al_{0.4}Ga_{0.6}As$ second confinement layer forming a curved active region on said first cladding layer;

a curved ridge waveguide formed from a p-type $Al_{0.5}In_{0.5}P$ second cladding layer formed above said active region, said curved ridge waveguide providing optical confinement for light emission from said active region, said curved ridge waveguide being defined by native oxide layers formed in grooves, said native oxide layers being formed from said second cladding layer and said active region; and first and second electrodes which enable biasing of said active region.

8. The ridge waveguide semiconductor ring laser of claim 7 wherein said native oxide layers comprise a native oxide of an aluminum-containing semiconductor material.

9. The ridge waveguide semiconductor ring laser of claim 7 wherein said active region underneath said ridge waveguide is narrower than said ridge waveguide.

10. A ridge waveguide semiconductor ring laser comprising:

a substrate;

an n-type first cladding layer formed on said substrate;

a first confinement layer, an active layer, and a second confinement layer forming a curved active region on said first cladding layer;

a curved ridge waveguide formed from a second cladding layer formed above said active region, said second cladding layer having a slower oxidation rate than said active region, said curved ridge waveguide providing optical confinement for light emission from said active region, said curved ridge waveguide being defined by native oxide layers formed in grooves, said native oxide layers being formed from said second cladding layer and said active region; and first and second electrodes which enable biasing of said active region.

11. The ridge waveguide semiconductor ring laser of claim 10 wherein said native oxide layers comprise a native oxide of an aluminum-containing semiconductor material.

12. The ridge waveguide semiconductor ring laser of claim 10 wherein said active region underneath said ridge waveguide is narrower than said ridge waveguide.

* * * * *

UNITED STATES PATENT AND TRADEMARK OFFICE
CERTIFICATE OF CORRECTION

PATENT NO. : 6,044,098
DATED : March 28, 2000
INVENTOR(S) : Decai Sun

It is certified that error appears in the above-identified patent and that said Letters Patent is hereby corrected as shown below:

Column 1,
Line 3, insert -- This invention was made with Government support under Agreement No. 70NANB2H1241 awarded by the Department of Commerce. The Government has certain rights in this invention. --.

Signed and Sealed this

Thirtieth Day of May, 2006

JON W. DUDAS
*Director of the United States Patent and Trademark Office*